United States Patent
Den Boef et al.

(10) Patent No.: US 7,312,860 B2
(45) Date of Patent: *Dec. 25, 2007

(54) TEST PATTERN, INSPECTION METHOD, AND DEVICE MANUFACTURING METHOD

(75) Inventors: Arie Jeffrey Den Boef, Waalre (NL); Hans Van Der Laan, Veldhoven (NL); Antonius Johannes Josephus Van Dijsseldonk, Hapert (NL); Mircea Dusa, Campbell, CA (US); Antoine Gaston Marie Kiers, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/594,075

(22) Filed: Nov. 8, 2006

(65) Prior Publication Data

US 2007/0052948 A1    Mar. 8, 2007

Related U.S. Application Data

(63) Continuation of application No. 10/696,742, filed on Oct. 30, 2003, now Pat. No. 7,151,594.

(30) Foreign Application Priority Data

Nov. 1, 2002    (EP)    .................... 02257609

(51) Int. Cl.
*G01B 9/00*    (2006.01)
(52) U.S. Cl. ..................................... 356/124
(58) Field of Classification Search ............... None See application file for complete search history.

(56) References Cited

U.S. PATENT DOCUMENTS 6,458,605 B1    10/2002    Stirton
2002/0041373 A1    4/2002    Littau et al.

FOREIGN PATENT DOCUMENTS

| EP | 0 985 977 A | 3/2000 |
|---|---|---|
| JP | 2002-131185 A | 5/2002 |
| JP | 2002-198303 A | 7/2002 |
| JP | 2002-260994 A | 9/2002 |

(Continued)

OTHER PUBLICATIONS

Japanese Office Auction issued in JP Patent Application No. 2003-408154 mailed Oct. 23, 2006.

(Continued)

*Primary Examiner*—Gregory J. Toatley, Jr.
*Assistant Examiner*—Amanda H Merlino
(74) *Attorney, Agent, or Firm*—Pillsbury Winthrop Shaw Pittman LLP

(57) ABSTRACT

In a method according to one embodiment of the invention, aberrations in a lithographic apparatus are detected by printing a test pattern having at least one degree of symmetry and being sensitive to a particular aberration in the apparatus, and using a scatterometer to derive information concerning the aberration. The test structure may comprise a two-bar grating, in which case the inner and outer duty ratios can be reconstructed to derive information indicative of comatic aberration. Alternatively, a hexagonal array of dots can be used, such that scatterometry data can be used to reconstruct dot diameters indicative of 3-wave aberration.

2 Claims, 4 Drawing Sheets

FOREIGN PATENT DOCUMENTS

| | | |
|---|---|---|
| JP | 2002-311564 A | 10/2002 |
| JP | 2005-513757 A | 5/2005 |
| WO | WO 02 21075 A | 3/2002 |
| WO | WO 02 065545 A | 8/2002 |
| WO | WO 02 070985 A | 9/2002 |
| WO | WO 02 077570 A | 10/2002 |
| WO | WO 03 001297 A | 1/2003 |

OTHER PUBLICATIONS

K.C. Hickman et al., "Use of Diffracted Light From Latent Images to Improve Lithography Control," Journal of Vacuum Science & Technology B, American Vacuum Society (USA), vol. 10 (No. 5), p. 2259-2266, (Sep./Oct. 1992).

E.L. Raab et al., "Analyzing Deep-UV Lens Aberrations Using Aerial Image and Latent Image Metrologies," SPIE, SPIE (USA), Mar. 2-4, 1994, p. 550-565, (vol. 2197).

Christopher J. Raymond et al., "Multiparameter Grating Metrology Using Optical Scatterometry," Journal of Vacuum Science & Technology B, 2nd ed., American-Institute of Physics for the American Vacuum Society (USA), vol. 15 (No. 2), p. 361-368, (Mar./Apr. 1997).

Xinhui Niu et al., "Specular Spectroscopic Scatterometry in DUV Lithography," Part of the SPIE Conference on Metrology, Inspection, and Process Control for Microlithography XIII, SPIE (Santa Clara, CA, USA), p. 159-168, (Mar. 1999) (vol. 3677).

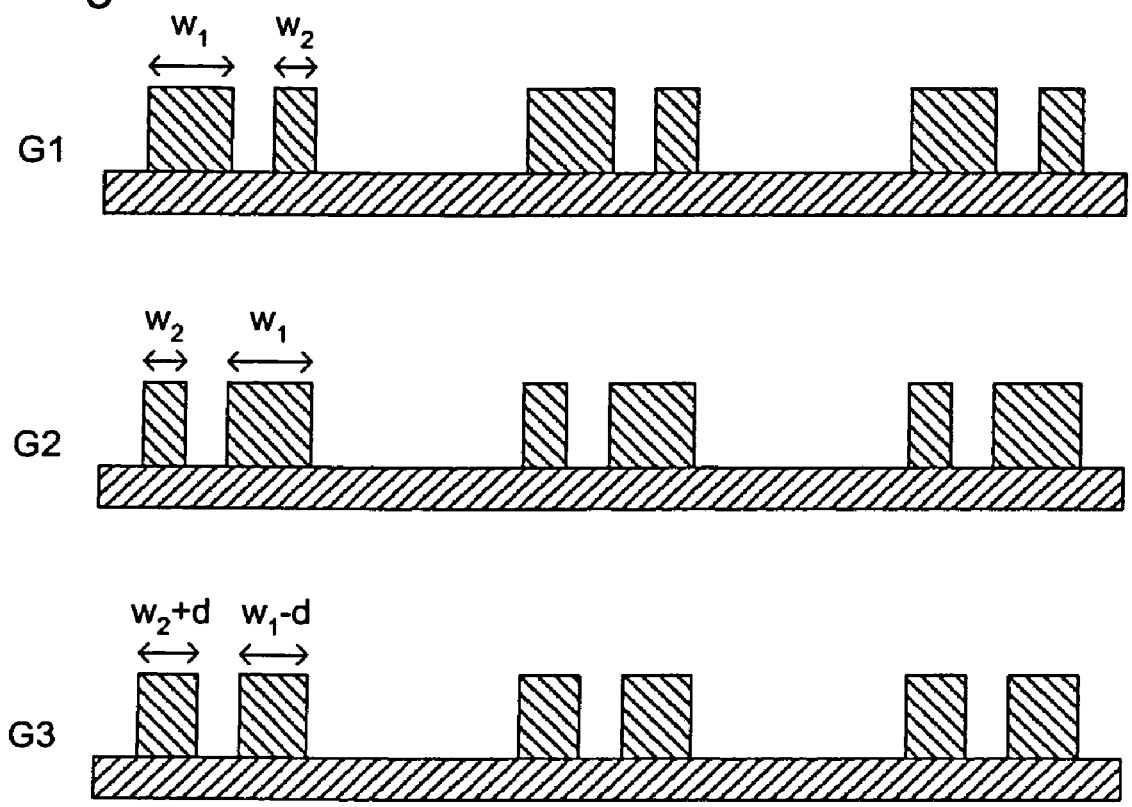

TEST PATTERN, INSPECTION METHOD, AND DEVICE MANUFACTURING METHOD

RELATED APPLICATIONS

This application is a continuation of U.S. application Ser. No. 10/696,742, filed Oct. 30, 2003 now U.S. Pat. No 7,151,594, which claims priority to European Patent Application EP 02257609.4, filed Nov. 1, 2002, each of which are incorporated herein by reference in their entirety.

FIELD OF THE INVENTION

The present invention relates to methods of inspection and manufacture.

BACKGROUND

In a manufacturing process using a lithographic projection apparatus, a pattern (e.g. in a mask) is imaged onto a substrate that is at least partially covered by a layer of radiation-sensitive material (resist). Prior to this imaging procedure, the substrate may undergo various other procedures such as priming, resist coating, and/or a soft bake. After exposure, the substrate may be subjected to other procedures, such as a post-exposure bake (PEB), development, a hard bake, and/or measurement/inspection of the imaged features. This array of procedures may be used as a basis to pattern an individual layer of a device (e.g. an IC). Such a patterned layer may then undergo various processes such as etching, ion-implantation (doping), metallization, oxidation, chemo-mechanical polishing, etc., all of which may be intended to finish off an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The measurement and inspection procedure following development of the resist, referred to as "in-line" because it is carried out in the normal course of processing production wafers, serves two purposes. Firstly, it is desirable to detect any target areas where the pattern in the developed resist may be faulty. If a sufficient number of dies are faulty, the wafer can be stripped of the patterned resist and re-exposed, hopefully correctly, rather than making the fault permanent by carrying out a process procedure (e.g. an etch) with a faulty pattern. Secondly, the measurements may allow errors in the lithographic apparatus (e.g. illumination settings or exposure times) to be detected and corrected for subsequent exposures.

However, many errors in the lithographic apparatus may not be easily detected or quantified from the patterns printed in exposures. Detection of a fault does not always lead directly to its cause. Thus, a variety of "off-line" procedures for detecting and measuring errors in the lithographic apparatus are known. These may involve replacing the substrate with a measuring device or carrying out exposures of special test patterns, e.g. at a variety of different machine settings. Such off-line techniques take time, often a considerable amount, during which the apparatus may not be available for production exposures. Therefore, in-line techniques (that is, ones which can be carried out using, or at the same time as, production exposures) for detecting and measuring errors in the lithographic apparatus are preferred.

One in-line method used in device manufacturing for measurements of linewidth, pitch and critical dimension (CD) makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999). In scatterometry, white light is reflected by periodic structures in the developed resist and the resulting reflection spectrum at a given angle detected. The structure giving rise to the reflection spectrum is reconstructed, e.g. using Rigorous Coupled-Wave Analysis (RCWA) or by comparison to a library of patterns derived by simulation.

Pattern asymmetry is an error that can have a number of sources in the lithographic apparatus, including aberrations in the projection system, non-aberration projection lens artifacts, the reticle and the resist processing. Existing techniques for measuring pattern asymmetry are difficult, off-line and do not directly measure the effects in resist, so that it is not guaranteed that measures taken to minimize the problem will have the desired effect in the finished product.

SUMMARY

An inspection method according to one embodiment of the invention includes using a lithographic apparatus to pattern a beam with a test pattern having at least one degree of symmetry and to project the pattern onto a substrate. The method also includes forming, at a surface of the substrate, a test structure corresponding to the test pattern. A reflection spectrum of the test structure is measured, and from the reflection spectrum, information indicative of an amount of at least one type of aberration of the lithographic apparatus is derived.

A device manufacturing method according to another embodiment of the invention includes the inspection method described above. This method also includes providing the substrate, which is at least partially covered by a layer of radiation-sensitive material, and using a radiation system to provide the beam. A patterning structure is used to endow the beam with the test pattern in its cross-section, and the patterned beam is projected onto a target portion of the layer of radiation-sensitive material.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 6 depicts three grating patterns useable in a method according to a third embodiment of the present invention.

In the Figures, corresponding reference symbols indicate corresponding parts.

DETAILED DESCRIPTION

Embodiments of the invention include methods of inspection useable in the manufacture of devices by lithographic techniques and methods of manufacturing devices using lithographic techniques. For example, an embodiment of the invention may be implemented to provide an in-line method of measuring pattern asymmetry during manufacture of devices using lithographic techniques.

Figure 1:
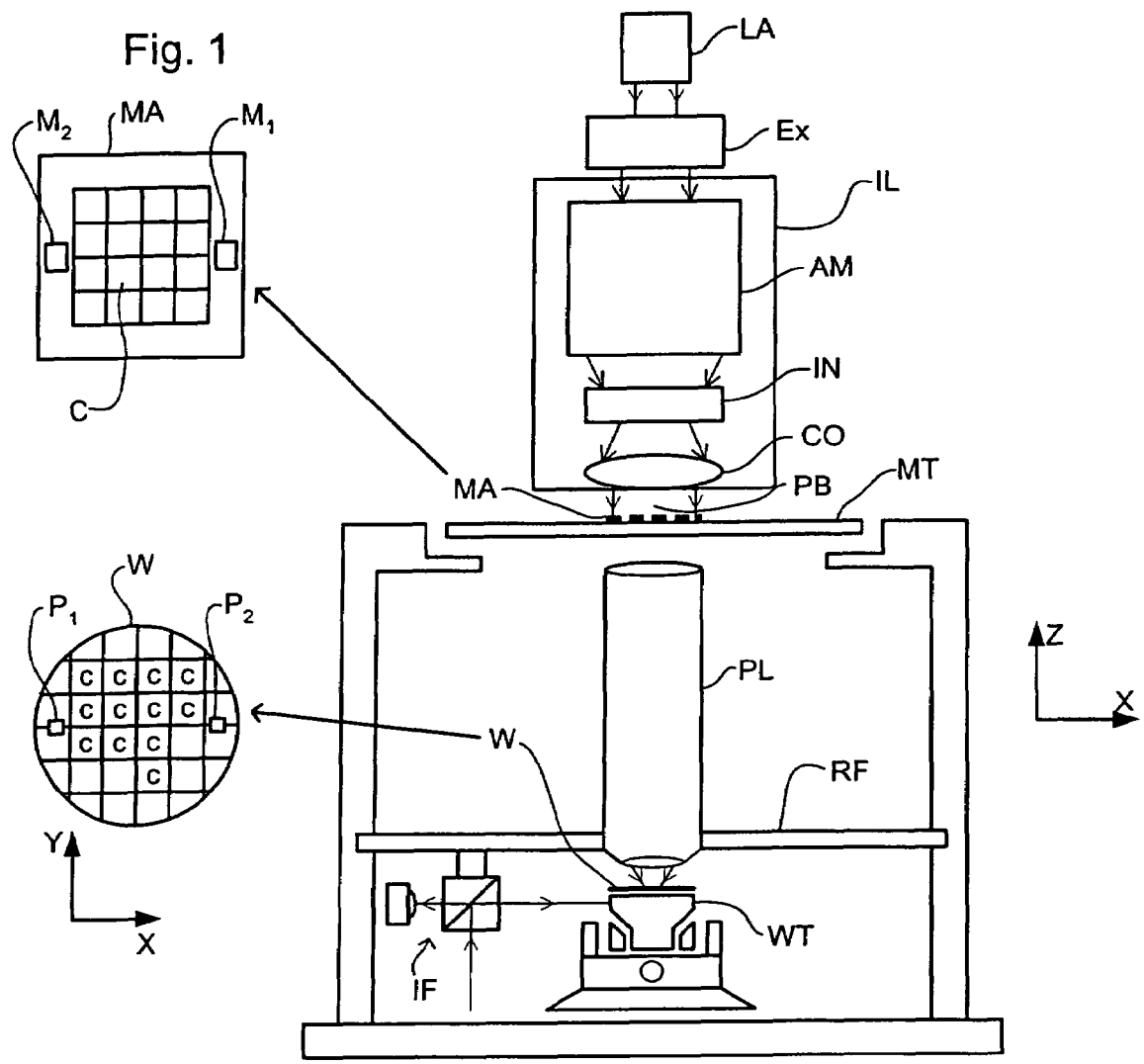
FIG. 1 depicts a lithographic projection apparatus that may be used to perform methods according to embodiments of the invention.

FIG. 1 schematically depicts a lithographic projection apparatus useable in methods according to the invention. The apparatus comprises:

A radiation system configured to supply (e.g. having structure capable of supplying) a projection beam of radiation. In this particular example, the radiation system Ex, IL, for supplying a projection beam PB of radiation (e.g. V, DUV, or EUV radiation) also comprises a radiation source LA;

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g.. a refractive lens group, a catadioptric or catoptric system, and/or a mirror system) is configured to image an irradiated portion of the mask MA onto a target portion C (e.g.. comprising one or more dies and/or portion(s) thereof) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source LA (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed.

Figure 2:
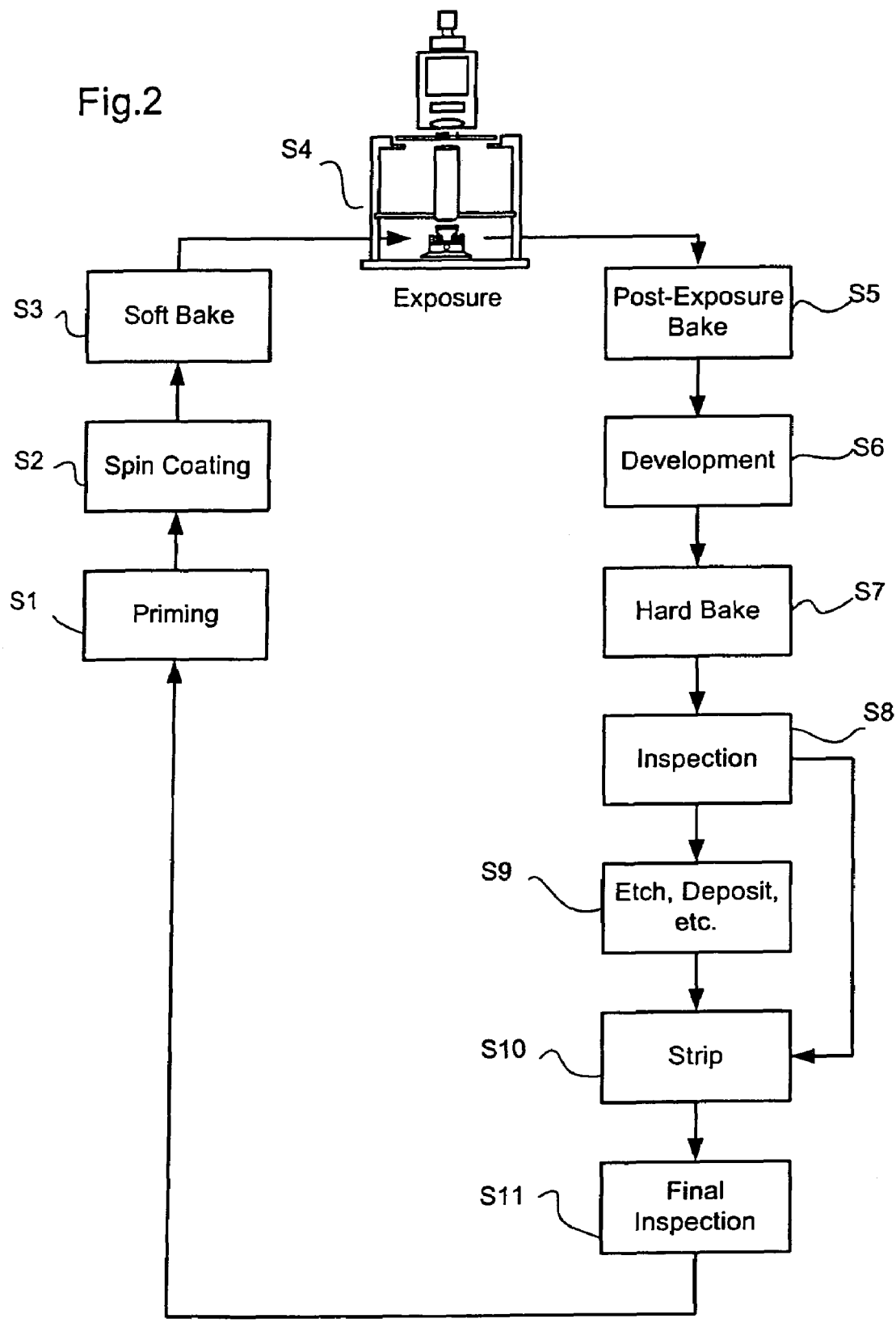
FIG. 2 is a flow diagram of a lithographic process according to an embodiment of the invention.

FIG. 2 is a flow diagram of a lithographic process of which the present invention may form a part. Prior to the exposure procedure S4, which may be carried out using a lithographic apparatus such as described above with relation to FIG. 1, a substrate (e.g. a silicon wafer) may undergo a priming procedure S1, a spin coating procedure S2 (e.g. to coat it with a layer of resist), and/or a soft bake S3 (e.g. to remove solvents from the resist). After exposure, the wafer may undergo a postexposure bake S5, a development procedure S6 during which the exposed or unexposed resist (depending on whether the resist is positive or negative) is removed, and/or a hard bake S7, prior to an inspection procedure S8.

The inspection procedure S8 may include various different measurements and inspections, such as a scatterometry procedure according to an embodiment of the invention and described further below. If the wafer passes inspection, a process procedure S9 may be carried out. Such a procedure may involve etching the areas of the substrate not covered by resist, deposition of a product layer, metallization, ion implantation, etc. After the process procedure S9, the remaining resist may be stripped S10 and a final inspection S11 carried out before the process resumes for another layer. In case a substrate fails an inspection at S8, it may be directed directly to a stripping procedure S10 and another attempt to print the same process layer made.

Figure 3:
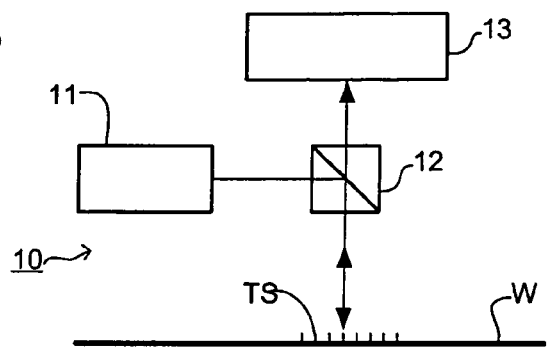
FIG. 3 depicts a scatterometer useable in methods according to embodiments of the present invention.

In the inspection procedure S8, a scatterometer such as depicted in FIG. 3 may be used. Other inspections and/or measurements may also be made using other tools. The scatterometer 10 comprises a broadband (e.g. white light) radiation source 11 which directs radiation (e.g. via a beamsplitter 12) onto a test structure TS on the wafer W. The reflected radiation is passed to a spectrometer 13 which measures a spectrum (intensity as a function of wavelength) of the specular reflected radiation. From this data, the structure giving rise to the detected spectrum may be reconstructed, e.g. by Rigorous Coupled Wave Analysis and non-linear regression or by comparison with a library of simulated spectra. In general, for the reconstruction the general form of the structure is known and some parameters are assumed from knowledge of the process by which the structure was made, leaving only a few parameters of the structure to be determined from the scatterometry data.

As illustrated, the scatterometer is a normal-incidence scatterometer. However, the same principle may be applied using inclined incidence scatterometry. Variants of scatterometry in which the reflection at a range of angles of a single wavelength is measured, rather than the reflection at a single angle of a range of wavelengths, may also be used.

Figure 4:
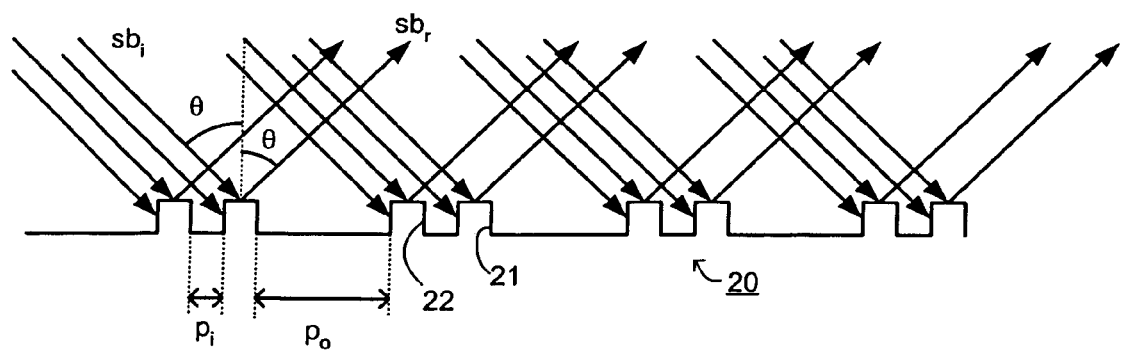
FIG. 4 depicts a grating pattern useable in a method according to a first embodiment of the present invention.

In a method according to a first embodiment of the invention, the test structure printed on the substrate W comprises a repeating two-bar grating as depicted in FIG. 4. The grating 20 comprises a pair of bars 21, 22 repeated a large number of times. The grating is printed such that after development, the bars are formed of solid resist lines. This pattern is sensitive to comatic aberrations in the lithographic projection apparatus, particularly the projection system PL, and illumination asymmetry and the presence of such aberrations will manifest themselves in a variation in the printed grating of the inner and outer duty ratios Pi, Po from their intended values. Accordingly, the scatterometry data of the printed grating 20 (e.g. the reflectance spectrum) is used to reconstruct the grating with the duty ratios Pi, Po as parameters of the reconstruction process. Deviations in the reconstructed duty ratios from the expected values are indicative of comatic aberration in the lithographic apparatus. Other parameters of the grating, such as linewidths and shapes, may be input to the reconstruction process from knowledge of the printing procedure and/or other scatterometry processes.

Such a method may be implemented to obtain a rapid measurement of aberration in the lithographic apparatus. The test pattern may be printed in the course of production exposures (for example, in a scribe lane or edge die or other unused area of the substrate) without requiring significant additional time. The reflection spectrum can be measured by the scatterometer equally quickly and without delaying the production line. Therefore, such a measurement method may be used in-line, as a qualification or calibration tool. If the lithographic apparatus is provided with suitable controls (e.g. adjustable elements in the projection lens), an immediate correction can be applied to improve imaging of subsequent wafers. Alternatively, if the measured aberration is sufficiently severe, the lithographic apparatus can be taken out of production for corrective maintenance straight away, before large numbers of defective wafers are produced.

It may be desired to carry out the scatterometry procedure on the pattern formed in developed resist, although if there is sufficient contrast in the latent resist image, the scatterometry procedure may be carried out before development. Because the aberration may be detected before a process procedure is carried out, if the aberration is severe enough to result in a defective device, the resist can be stripped and the substrate put back into the process for re-imaging.

Figure 5:
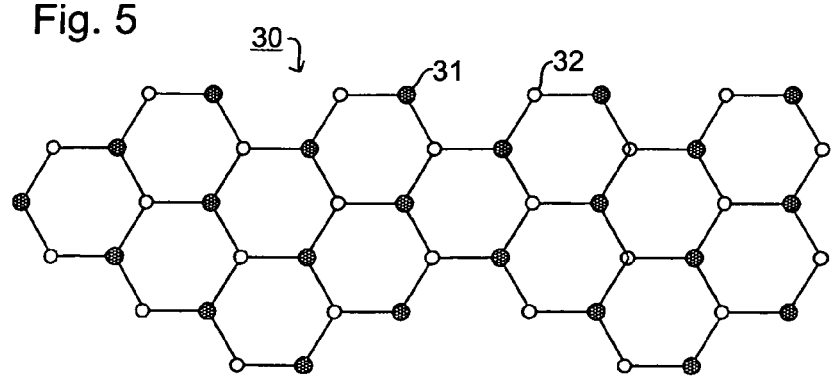
FIG. 5 depicts a grating pattern useable in a method according to a second embodiment of the present invention.

A grating structure useable in a method according to a second embodiment of the present invention is depicted in FIG. 5. This grating structure is a two-dimensional grating with a hexagonal unit cell with a dot at each corner of the unit cell. This pattern is sensitive to three-wave aberration which will cause the diameter of the dots 31 (shown as shaded) to change relative to the dots 32 (shown as open). The ratio of the diameters of the black dots to the white dots can be recovered from the scatterometry data.

In a method according to this embodiment, the test pattern may comprise a hexagonal array of dots, and the reflectance spectrum measured by the scatterometer may be used to reconstruct the diameters of the dots. Differences in the diameters of the first, third and fifth dots in each unit cell compared to the second, fourth and sixth dots, are indicative of 3-wave aberrations.

In a method according to a third embodiment of the present invention, three test grating structures are used to measure comatic aberrations without the need to reconstruct the grating structures. Such reconstruction may be computationally intensive and is not always possible if the number and thickness of the underlying layers is not known. FIG. 6 depicts three gratings G1, G2 and G3 which may be used in one example of a method according to this embodiment of the present invention.

As depicted in FIG. 6, gratings G1, G2 and G3 each comprise repeating two-bar structures. Gratings G1 and G2 are mirror symmetric with bars of width w1 and w2. Compared to a two-bar structure with equal line widths, G1 and G2 have equal, but opposite asymmetries. If these gratings are printed perfectly, with no comatic aberration, then using a normal incidence scatterometer the two gratings will generate identical scatterometry signals S1 and S2 because they are mirror symmetric. Thus, with no comatic aberration we have:

$$S1-S2=0 \quad (1)$$

If a small amount of comatic aberration is present, however, the ideal linewidths w1 and w2 will change in opposite directions by an amount $\Delta w$ giving:

$$w1'=w1+\Delta w,\ w2'=w2-\Delta w \quad (2)$$

Assuming that the scatterometry signal is linear for small aberrations, the difference between the two scatterometry signals will then be given by:

$$S1-S2=2(dS/dw)\times\Delta w \quad (3)$$

The derivative $dS/dw$ may be measured using a third grating. In this example, grating G3 is similar to the second grating G2 but has an additional small asymmetry d in the linewidth. Comparing the scatterometry signal S3 from grating G3 with S2 from grating G2 yields:

$$dS/dw=(S3-S2)/d \quad (4)$$

Substitution into equation (3) yields the linewidth change $\Delta w$ caused by comatic aberration:

$$\Delta w=[(S1-S2)/(S3-S2)]\times d/2 \quad (5)$$

The values S1, S2 and S3 can be taken directly from the scatterometry data for a variety of wavelengths to enable simple calculation of the error introduced by any comatic aberration. In the event that the scatterometer response is not linear, such a method may also be implemented to use signals from additional gratings. For example, such gratings may be similar to G3 but have different values of d. This technique can also be applied to a hexagon array used to measure 3-wave aberrations (e.g. as shown in FIG. 5).

In a method according to this embodiment, the test pattern may comprise first, second and third structures of the same basic form, such that the first and second structures have equal, but opposite, asymmetric deviations from said basic form. The third structure may then have an additional asymmetric deviation as compared to the second structure. Further structures may also be used, e.g. with the results being averaged to reduce noise. First, second and third reflection spectra are obtained from the respective structures, and the information indicative of the amount of aberration is derived by dividing the difference between the first and second scatterometry signals by the difference between the third and second scatterometry signals. By such a method, information about the aberration in the lithographic apparatus can be obtained without needing to reconstruct the structure from the scatterometry signal, which may be computationally intensive and is not always numerically robust.

As noted above, such a method may be applied to measure comatic aberration using a test pattern in which the first, second and third structures are two-bar gratings, the first structure has bar widths $W_1$ and $W_2$ (where $W_1>W_2$), the second structure is a mirror image of the first structure, and the third structure has bar widths $W_2+d$ and $W_1-d$, where $d<(W_1-W_2)$.

Of course, in methods according to embodiments of the invention as described herein, other test patterns sensitive to other aberrations may be used and multiple test patterns of the same or different types may printed on the same substrate. It may be desirable to carry out the scatterometry procedure(s) using normal incidence, white light scatterometry.

In a device manufacturing method according to an embodiment of the invention, it may be desirable to print the test pattern in an area adjacent the pattern of the production layer, such as a scribe lane. In this way, no unnecessary space is taken up on the substrate, and a maximum area remains available for production of devices.

In methods according to such an embodiment of the invention, the information indicative of the amount of the at least one type of aberration may be used to adjust a parameter of the lithographic apparatus, after which a further substrate may be provided and acts of providing a projection beam, using patterning structure, and projecting the patterned beam, may be repeated. In such manner, the results of scatterometry measurements taken on one substrate can be used to adjust the lithographic apparatus so that subsequent exposures are improved.

Whilst specific embodiments of the invention have been described above, it will be appreciated that the invention as claimed may be practiced otherwise than as described. It is explicitly noted that the description of these embodiments is not intended to limit the invention as claimed.

What is claimed is:

1. An inspection method comprising:
   using a lithographic apparatus to pattern a beam with a test pattern having at least one degree of symmetry and to project the pattern onto a substrate;
   forming, at a surface of the substrate, a test structure corresponding to the test pattern;
   measuring a reflection spectrum of the test structure;
   deriving, from the reflection spectrum, information indicative of an amount of at least one type of aberration of the lithographic apparatus; and
   making available for use, the information indicative of an amount of at least one type of aberration,
   wherein the test pattern comprises a hexagonal array of dots, and said information includes information indicative of three-wave aberrations.

2. An inspection method comprising:
   using a lithographic apparatus to pattern a beam with a test pattern having at least one degree of symmetry and to project the pattern onto a substrate;
   forming, at a surface of the substrate, a test structure corresponding to the test pattern;
   measuring a reflection spectrum of the test structure;
   deriving, from the reflection spectrum, information indicative of an amount of at least one type of aberration of the lithographic apparatus; and
   making available for use, the information indicative of an amount of at least one type of aberration,
   wherein said test pattern comprises first, second and third structures having a common basic symmetric form, and
   wherein said first and second structures have equal but opposite asymmetric deviations from the common basic symmetric form.

* * * * *